(12) United States Patent
Wang

(10) Patent No.: US 9,431,215 B2
(45) Date of Patent: Aug. 30, 2016

(54) CHIP PACKAGING STRUCTURES AND TREATMENT METHODS THEREOF

(71) Applicant: Semiconductor Manufacturing International (Shanghai) Corporation, Shanghai (CN)

(72) Inventor: Qifeng Wang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/681,234

(22) Filed: Apr. 8, 2015

(65) Prior Publication Data

US 2015/0325544 A1    Nov. 12, 2015

(30) Foreign Application Priority Data

May 12, 2014    (CN) .......................... 2014 1 0198249

(51) Int. Cl.
*H01L 21/02*    (2006.01)
*H01L 23/00*    (2006.01)
*H01J 37/32*    (2006.01)
*H01L 21/50*    (2006.01)

(52) U.S. Cl.
CPC ......... *H01J 37/32* (2013.01); *H01L 21/02068* (2013.01); *H01L 21/50* (2013.01); *H01L 24/11* (2013.01); *H01L 24/14* (2013.01); *H01L 2224/0231* (2013.01); *H01L 2224/0239* (2013.01); *H01L 2224/0401* (2013.01); *H01L 2224/05082* (2013.01); *H01L 2224/05147* (2013.01); *H01L 2224/05166* (2013.01); *H01L 2224/1181* (2013.01); *H01L 2224/13024* (2013.01); *H01L 2224/13111* (2013.01); *H01L 2224/13139* (2013.01); *H01L 2224/13147* (2013.01); *H01L 2924/014* (2013.01); *H01L2924/01013* (2013.01); *H01L 2924/01029* (2013.01); *H01L 2924/05042* (2013.01); *H01L 2924/05442* (2013.01); *H01L 2924/07025* (2013.01)

(58) Field of Classification Search
CPC .................. H01L 21/02225; H01L 21/02263; H01L 21/02312; H01L 21/02315; H01L 21/02318; H01L 24/11; H01L 24/14; H01L 2224/0239; H01L 2224/0231; H01L 2224/04026; H01L 2224/05147; H01L 2224/13147; H01L 2224/13111; H01L 2224/13024; H01L 2224/13124; H01L 2924/01029; H01L 2924/01013; H01L 2924/014; H01L 2924/05042; H01L 2924/05442; H01L 2924/07025; H01L 21/50; H01L 21/02068; H01L 2224/1181; H01L 2224/0401; H01L 2224/05082; H01L 2224/05166; H01L 2224/13139
See application file for complete search history.

(56) References Cited

U.S. PATENT DOCUMENTS 6,300,234 B1 * 10/2001 Flynn ...................... H01L 24/03
257/E21.508
2008/0293234 A1 * 11/2008 Ikumo ................. H01L 23/3171
438/613

*Primary Examiner* — Jasmine Clark
(74) *Attorney, Agent, or Firm* — Anova Law Group, PLLC

(57) ABSTRACT

A method for treating a chip packaging structure includes providing a chip packaging structure having at least a first electrical connect structure and a second electrical connect structure, and an insulation layer exposing portions of the first electrical connect structure and the second electrical connect structure; selecting a plasma gas based on materials of the first electrical connect structure and the second electrical connect structure and a type of process forming the first electrical connect structure and the second electrical connect structure, wherein metal cations are left on the insulation layer; performing a plasma treatment process using the selected plasma gas on the first electrical connect structure, the second electrical connect structure and the insulation layer, causing reaction of the metal cations to substantially convert the metal cations into electrically neutral materials; and removing the reacted metal cations from the insulation layer.

20 Claims, 2 Drawing Sheets

CHIP PACKAGING STRUCTURES AND TREATMENT METHODS THEREOF

CROSS-REFERENCES TO RELATED APPLICATIONS

This application claims the priority of Chinese patent application No. 201410198249.8, filed on May 12, 2014, the entirety of which is incorporated herein by reference.

FIELD OF THE INVENTION

The present invention generally relates to the field of semiconductor technology and, more particularly, relates to chip packaging structures and treatment processes thereof.

BACKGROUND

In an IC chip packaging process, after certain steps, metal and/or metal ions may be deposited on the insulation layer between adjacent electrical connect structures, such as soldering balls (bumps), and soldering pads, etc. Such metal ions are generated by plasma etching processes, and/or wet etching processes, etc. For example, tin and/or tin ions may be deposited on the insulation layer between the adjacent tin soldering balls. Such metal and/or metal ions are able to cause a leakage current issue between the two adjacent electrical contact structures. Thus, the final test (FT) may fail.

In order to solve the FT failure caused by the deposition of the metal and/or metal ions, some technical approaches have been developed. For example, an argon plasma treatment process is performed on the insulation layer to remove the metal and/or the metal ions; and then the removed metal and/or metal ions are pumped away by the vacuum system of the plasma instrument.

However, in practical processes, using the argon plasma to remove the metal and/or metal ions has certain limitations because it is a physical process. The metal and/or metal ions may not be entirely removed. Further, the argon plasma may damage the surface of the dielectric layer. Thus, the leakage current may still be generated between adjacent electrical connect structures. The disclosed device structures and methods are directed to solve one or more problems set forth above and other problems.

BRIEF SUMMARY OF THE DISCLOSURE

One aspect of the present disclosure includes a method for treating a chip packaging structure. The method includes providing a chip packaging structure having at least a first electrical connect structure and a second electrical connect structure, and an insulation layer insulating the first electrical connect structure and the second electrical connect structure and also exposing portions or all of the first electrical connect structure and the second electrical connect structure; and selecting a plasma gas based on materials of the first electrical connect structure and the second electrical connect structure and a type of process forming the first electrical connect structure and the second electrical connect structure, wherein metal cations are left on the insulation layer. Further, the method also includes performing a plasma treatment process using the selected plasma gas including one of at least oxygen and nitrogen on the first electrical connect structure, the second electrical connect structure and the insulation layer, causing reaction of the metal cations to substantially convert the metal cations into electrically neutral materials; and removing the reacted metal cations from the insulation layer.

Another aspect of the present disclosure includes a chip packaging structure. The chip packaging structure includes a substrate having a plurality of devices; and a metal interconnect structure electrically connecting with the devices formed on the substrate. Further, the chip packaging structure also includes at least one first electrical connect structure and one second electrical connect structure electrically connecting with the metal interconnect structure formed over the metal interconnect structure; and an insulation layer insulating the first electrical connect structure and the second electrical connect structure and also exposing portion or all of the first electrical connect structure and the second electrical connect structure, wherein the insulation has a material structure being treated by a plasma treatment process using a plasma gas, selected based on materials of the first electrical connect structure and the second electrical connect structure and a type of process forming the first electrical connect structure and the second electrical connect structure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
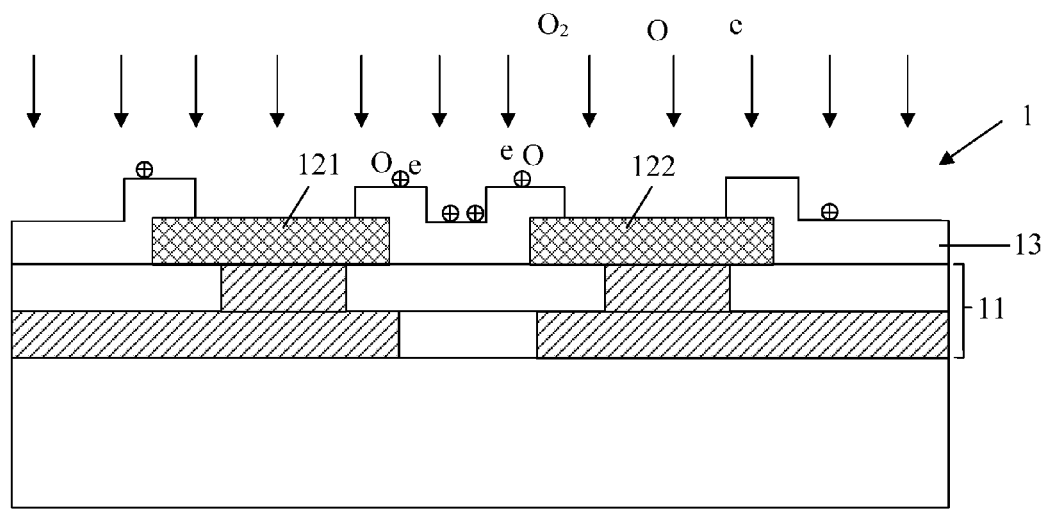
FIG. 1 illustrates a structure corresponding to certain stages of an exemplary treatment process of a chip packaging structure consistent with the disclosed embodiments.
Figure 4:
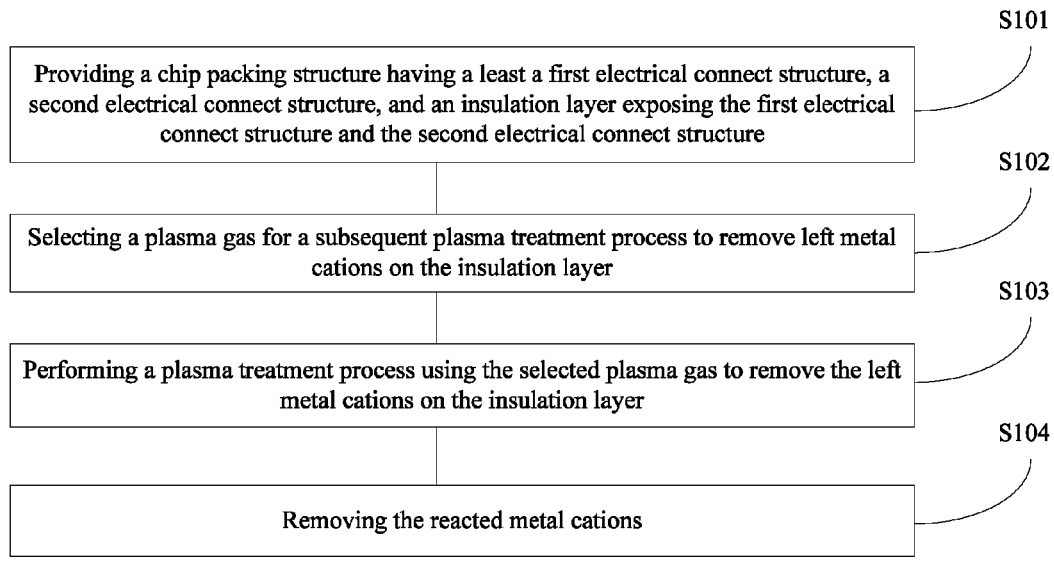
FIG. 4 illustrates the exemplary treatment process of a chip packaging structure.

FIG. 4 illustrates an exemplary treatment process of a chip packaging structure; and FIG. 1 illustrates a structure corresponding to certain stages of the exemplary treatment process of a chip packaging structure.

At the beginning of the treatment process, a chip packaging structure is provided (S101). As shown in FIG. 1, a chip packaging structure 1 is provided. The chip packaging structure 1 may include a semiconductor substrate (not labeled), a metal interconnect structure 11, an insulation layer 13, a first electrical connect structure 121 and a second electrical connect structure 122. In one embodiment, the first electrical connect structure 121 is a first solder pad 121; and the second electrical connect structure 122 is a second soldering pad 122. A portion of the first soldering pad 121 and a portion of the second soldering pad 122 may be exposed by the insulation layer 13. In certain other embodiments, the chip packaging structure 1 may have one electrical connect structure, or more than two electrical connect structures.

A plurality of semiconductor devices, such as transistors, resistors and inductors, etc., may be formed in and/or on the substrate. The first soldering pad 121 and the second soldering pad 122 may be electrically connected with the semiconductor devices through the metal interconnect structure 11. The first soldering pad 121 and the second soldering pad 122 may be electrically insulated by the insulation layer 13.

The substrate may be made of any appropriate material, such as Si, Ge, SiGe, or glass, etc. The insulation material of the metal interconnect structure 11 may be made of silicon oxide, silicon nitride, or silicon oxynitride, etc. The metal material of the metal interconnect structure 11 may be made of Cu, W, or Al, etc.

The insulation layer 13 may be made of any appropriate material, such as silicon oxide, silicon nitride, or silicon oxynitride, etc. In one embodiment, the insulation layer 13 may be a passive layer to prevent moisture, or contaminations, etc. Thus, the insulation layer 13 may be made of silicon nitride.

In certain other embodiments, the metal of the soldering pads may have a relatively large stress. The stress may cause the dielectric layer of the metal interconnect structure 11 to crack. Thus, in order to avoid the crack, the insulation layer 13 may be made of polyimide.

The first soldering pad 121 and the second soldering pad 122 may be formed by any appropriate process. In one embodiment, the first soldering pad 121 and the second soldering pad 122 may be formed by forming a metal layer (not labeled) on the metal interconnect structure 11. The metal layer may be made of any appropriate material, such as Cu, or Al, etc. The metal layer may electrically connect with the metal interconnect structure 11. After forming the metal layer, the metal layer may be patterned by any appropriate processes to form the first soldering pad 121 and the second soldering pad 122. In one embodiment, the metal layer may be patterned by a dry etching process.

During the dry etching process, the by-products may not be entirely removed. Thus, the copper cations, metal losing a certain number of electrons, or the aluminum cations may be deposited on the insulation layer 13. The metal cations deposited on the insulation layer 13 may cause a leakage current issue between the first soldering pad 121 and the second soldering pad 122 when the IC chip is in operation.

Returning to FIG. 4, after providing the chip packaging structure 1, a plasma gas may be selected for performing a plasma treatment process to remove the metal cations left on the insulation layer 13 (S102). The plasma gas may selected based on materials of the first soldering pad 121 and the second soldering pad 122 and a type of process forming the first soldering pad 121 and the second soldering pad 122. For example, if the first soldering pad 121 and the second soldering pad 122 are made of Cu, $O_2$ may be selected as the plasma gas. If the first soldering pad 121 and the second soldering pad 122 are made of Al, $N_2$ may be selected as the plasma gas.

Further, after selecting the plasma gas, a plasma treatment process may be performed (S103). The corresponding structure is referred to FIG. 1.

Referring to FIG. 1, a plasma treatment process is performed on the first soldering pad 121, the second soldering pad 122, and the insulation layer 13 to remove the metal cations left on the insulation layer 13. Specifically, selected plasma, i.e., plasma using the selected plasma gas may be used to bombard the first soldering pad 121, the second soldering pad 122, and the insulation layer 13 exposing the first soldering pad 121 and the second soldering pad 122 to remove the metal cations.

In one embodiment, the plasma gas is $O_2$. Thus, the plasma may be referred as oxygen plasma. The $O_2$ pressure in the reaction chamber of the oxygen plasma may be in a range of approximately $1E10^{-9}$ Pa~$1E10^{-6}$ Pa. The voltage of the oxygen plasma may be in a range of approximately 900V~1100V. The frequency of the oxygen plasma may be in a range of approximately 45 Hz~55 Hz.

During the oxygen plasma treatment process, $O_2$ may be ionized into O ions and electrons "e", etc. The O ions and the electrons may neutralize, and/or react with metal cations. The following reactions may happen:

$$Cu^{2+}+O+2e \rightarrow Cu+O$$

$$Cu^{e+}+O+2e \rightarrow CuO$$

The metal Cu and the CuO may be electrically neutral. Thus, the metal Cu and the CuO may not have an electrostatic attraction with the insulation layer 13; and the metal Cu and the CuO may be easy to be removed from the surface of the insulation layer 13. Further, the metal Cu and the CuO is not re-deposited on the insulation layer 13. Thus, it may only need to pump the reaction chamber to remove the metal Cu and the CuO out the reaction chamber.

In one embodiment, the flow rate of $O_2$ may be in a range of approximately 5 sccm~25 sccm. Such a flow rate may aid the generated O ions and/or electrons to react with the metal cations to form metal and/or metal compounds.

The plasma treatment time may be in a range of approximately 100 s~150 s. In one embodiment, the treatment time is 120 s. Such a treatment time may not only entirely neutralize the metal cations to form metal and/or metal compounds, but also avoid damage to the surface of the insulation layer 13 during the bombarding process on the surfaces of the first soldering pad 121, the second soldering pad 122, and the insulation layer 13.

In certain other embodiments, the plasma gas is $N_2$. Thus, the plasma may be referred as nitrogen plasma. The pressure of $N_2$ in the reaction chamber of the nitrogen plasma may be in a range of approximately $1E10^{-9}$ Pa~$1E10^{-6}$ Pa. The voltage of the nitrogen plasma may be in a range of approximately 900V~1100V. The frequency of the nitrogen plasma may be in a range of approximately 45 Hz~55 Hz. The power of the nitrogen plasma may be in a range of approximately 270 W~330 W.

In the nitrogen plasma treatment process, $N_2$ may be ionized into N ions and electrons "e", etc. The N ions and the electrons "e" may have following reactions with the metal cations on the surface of the insulation layer 13:

$$Al^{3+}+N+3e \rightarrow Al+N$$

$$Al^{3+}+N+3e \rightarrow AlN$$

The metal Al and the AlN may be electrically neutral. Thus, the metal Al and the AlN may have no electrostatic attraction with the insulation layer 13; and it may be easy for the metal Al and the AlN to leave the surface of the dielectric layer 13. Further, the metal Al and the AlN is not re-deposited on the surface of the dielectric layer 13. Thus, it may only need to pump the reaction chamber to remove the metal Al and the AlN out the reaction chamber.

In one embodiment, the flow rate of $N_2$ may be in a range of approximately 5 sccm~25 sccm. Such a flow rate of $N_2$ may aid the N ions and the electrons generated by the plasma to react with the metal cations to form the metal Al and/or the AlN to remove the metal cations.

In one embodiment, the nitrogen plasma treatment time may be in a range of approximately 100 s~150 s. Such a treatment time may not only neutralize the metal cations to form the metal and/or the metal compounds; but also avoid damage to the surface of the insulation layer 13 during the nitrogen plasma treatment process.

Returning to FIG. 4, when the plasma treatment process is being performed, the reacted metal cations may be removed (S104). The reacted metal cations are removed by pumping the reaction chamber.

After the plasma treatment process using one or more of $O_2$ and $N_2$, the metal cations may be removed. Thus, the leakage issue between the first soldering pad 121 and the second soldering pad 122 may be overcome. Further, by using the oxygen plasma or the nitrogen plasma, the damage to the surface of the insulation layer 13 and the metal interconnect structure 11 may be avoided. Therefore, the reliability of the chip packaging structure 1 may be improved.

Figure 2:
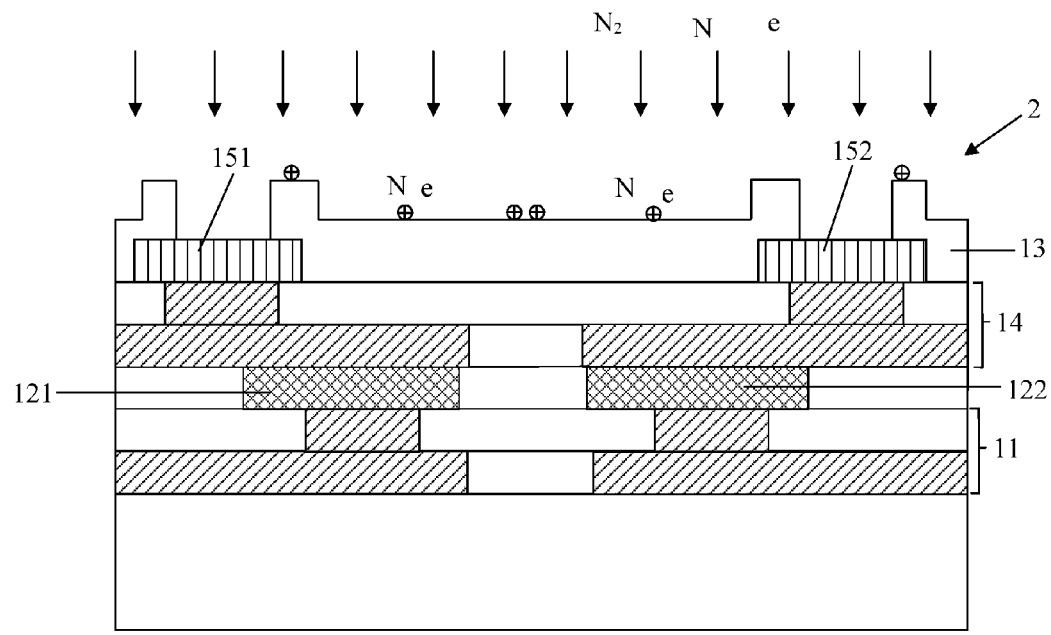
FIG. 2 illustrates another structure corresponding to certain stages of the exemplary treatment process of a chip packaging structure consistent with the disclosed embodiments.

FIG. 2 illustrates another structure corresponding to a certain stage of the exemplary treatment process of a chip packaging structure illustrated in FIG. 4. At the beginning of the treatment process, a chip packaging structure is provided (S101).

As shown in FIG. 2, a chip packaging structure 2 is provided. In one embodiment, the chip packaging structure 2 is formed by forming a second metal interconnect structure 14 on the chip packaging structure 1 illustrated in FIG. 1; and then forming a first electrical connect structure 151 and a second electrical connect structure 152 on the second metal interconnect structure 14. In one embodiment, the first electrical connect structure 151 is a first re-distribution layer 151; and the second electrical connect structure 152 is a second re-distribution layer 152. The first re-distribution layer 151 may be electrically connected with the first soldering pad 121 through the second metal interconnect structure 14. The second re-distribution layer 152 may be electrically connected with the second soldering pad 122 through the second metal interconnect structure 14.

Further, portions of the first re-distribution layer 151 and the second re-distribution layer 152 may be exposed by the insulation layer 13. The insulation layer 13 may also electrically insulate the first redistribution layer 151 and the second re-distribution layer 152. In certain other embodiments, the chip packaging structure 2 may include one re-distribution layer, or more than two re-distribution layers.

The first re-distribution layer 151 and the second re-distribution layer 152 may be used to electrically re-distribute the first soldering pad 121 and the second soldering pad 122. Specifically, the positions of the first soldering pad 121 and the second soldering pad 122 and the distance between the first soldering pad 121 and the second soldering pad 122 may be re-arranged by the first re-distributing pad 151 and the second re-distributing pad 152. Such as re-distribution may increase the device density in the chip packaging structure 2.

The insulation material of the second metal interconnect structure 14 may be made of silicon oxide, silicon nitride, or silicon oxynitride, etc. The metal material of the second metal interconnect structure 14 may be made of Cu, W, or Al, etc.

The insulation layer 13 may be made of any appropriate material, such as silicon oxide, silicon nitride, or silicon oxynitride, etc. In one embodiment, the insulation layer 13 may be a passive layer to prevent moisture, or contaminations, etc. Thus, the insulation layer 13 may be made of silicon nitride.

In certain other embodiments, the metal of the soldering pads may have a relatively large stress. The stress may cause the dielectric layer in the metal interconnect structure 13 to crack. Thus, in order to avoid the crack, the insulation layer 13 may be made of polyimide.

The first re-distribution layer 151 and the second re-distribution layer 152 may be formed by any appropriate process. In one embodiment, the first re-distribution layer 151 and the second re-distribution layer 152 may be formed by forming a metal layer (not labeled) on the second metal interconnect structure 14. The metal layer may be made of one of Cu and Al, etc. The metal layer may be electrically connected with the second metal interconnect structure 14. After forming the metal layer, the metal layer may be patterned by any appropriate processes to form the first re-distribution layer 151 and the second re-distribution layer 152. In one embodiment, the metal layer may be patterned by a dry etching process.

During the dry etching process, the by-products may not be entirely removed. Thus, copper cations or aluminum cations may be deposited on the insulation layer 13. The metal cations deposited on the insulation layer 13 may cause a leakage issue between the first re-distribution layer 151 and the second re-distribution layer 152.

Returning to FIG. 4, after providing the chip packaging structure 1, a plasma gas may be selected for performing a plasma treatment process to remove the metal cations left on the insulation layer 13 (S102). The plasma gas may selected based on materials of the first re-distribution layer 151 and the second redistribution layer 152 and a type of process forming the first re-distribution layer 151 and the second re-distribution layer 152. For example, if the first re-distribution layer 151 and the second re-distribution layer 152 are made of Cu, $O_2$ may be selected as the plasma gas. If the first re-distribution layer 151 and the second re-distribution layer 152 are made of Al, $N_2$ may be selected as the plasma gas.

Further, after selecting the plasma gas, a plasma treatment process may be performed (S103). The corresponding structure is referred to FIG. 2.

Referring to FIG. 2, after providing the chip packaging structure 2, a plasma treatment process is performed on surface of the chip packaging structure 2. Specifically, selected plasma may be used to bombard the first re-distribution layer 151, the second re-distribution layer 152 and the insulation layer 13 exposing first re-distribution layer 151 and the second re-distribution layer 152.

In one embodiment, the plasma gas is $O_2$. Thus, the plasma may be referred as oxygen plasma. The $O_2$ pressure in the reaction chamber of the oxygen plasma treatment process may be in a range of approximately $1E10^{-9}$ Pa~$1E10^{-6}$ Pa. The voltage of the plasma may be in a range of approximately 900V~1100V. The frequency of the oxygen plasma may be in range of approximately 45 Hz~55 Hz.

During the oxygen plasma process, the $O_2$ may be ionized into O ions and electrons "e", etc. The O ions and the electrons "e" may react with metal cations. The following reactions may happen:

$$Cu^{2+}+O+2e \rightarrow Cu+O$$

$$Cu^{2+}+O+2e \rightarrow CuO$$

The metal Cu and the CuO may be electrically neutral. Thus, the metal Cu and the CuO may not have an electrostatic attraction with the insulation layer 13; and the metal Cu and the CuO may be easy to be removed from the surface of the insulation layer 13. Further, the metal Cu and the CuO is not re-deposited on the insulation layer 13. Thus, it may only need to pump the reaction chamber to remove the Cu and the CuO out the reaction chamber.

In one embodiment, the flow rate of $O_2$ may be in a range of approximately 5 sccm~25 sccm. Such a flow rate may aid the generated O ions and/or electrons to react with the metal cations to form the metal and/or the metal compounds.

The oxygen plasma treatment time may be in a range of approximately 100 s~150 s. In one embodiment, the oxygen plasma treatment time is 120 s. Such a treatment time may not only entirely neutralize the metal cations to form metal and/or metal compounds, but also avoid damage to the surface of the insulation layer 13 during the bombarding process on the surface of the insulation layer 13.

In certain other embodiments, the gas of the plasma is $N_2$. Thus, the plasma may be referred as nitrogen plasma. The pressure of $N_2$ in the reaction chamber may be in a range of approximately $1E10^{-9}$ Pa~$1E10^{-6}$ Pa. The voltage of the nitrogen plasma may be in a range of approximately 900V~1100V. The frequency of the nitrogen plasma may be in a range of approximately 45 Hz~55 Hz. The power of the nitrogen plasma may be in a range of approximately 270 W~330 W.

In the nitrogen plasma treatment process, $N_2$ may be ionized in to N ions and electrons "e", etc. The N ions and the electrons "e" may have following reactions with the metal cations on the surface of the insulation layer 13:

$$Al^{3+}+N+3e \rightarrow Al+N$$

$$Al^{3+}+N+3e \rightarrow AlN$$

The metal Al and the AlN may be electrically neutral. Thus, the metal Al and the AlN may have no electrostatic attraction with the insulation layer 13; and it may be easy for the metal Al and the AlN to leave the surface of the dielectric layer 13. Further, the metal Al and the AlN may not be re-deposited on the surface of the dielectric layer 13. Thus, it may only need to pump the reaction chamber to remove the metal Al and the AlN out the reaction chamber.

In one embodiment, the flow rate of $N_2$ may be in a range of approximately 5 sccm~25 sccm. Such a flow rate of $N_2$ may aid the N ions and the electrons generated by the nitrogen plasma to react with the metal cations to form the metal Al and/or the AlN.

In one embodiment, the nitrogen plasma treatment time may be in a range of approximately 100 s~150 s. Such a treatment time may not only neutralize the metal cations to form the metal and/or the metal compounds; but also avoid the damage to the surface of the insulation layer 13 during the nitrogen plasma treatment process.

Returning to FIG. 4, when the plasma treatment process is being performed, the reacted metal cations may be removed (104). The reacted metal cations is removed by pumping the reaction chamber After the plasma treatment process using one of $O_2$ and $N_2$, the metal cations on the insulation layer 13 may be removed. Thus, the leakage current issue between the first re-distribution layer 151 and the second re-distribution layer 152 may be overcome. Further, by using the $O_2$ plasma or the $N_2$ plasma, the damage to the surface of the insulation layer 13 may be avoided. Therefore, the reliability of the chip packaging structure 2 may be improved.

Figure 3:
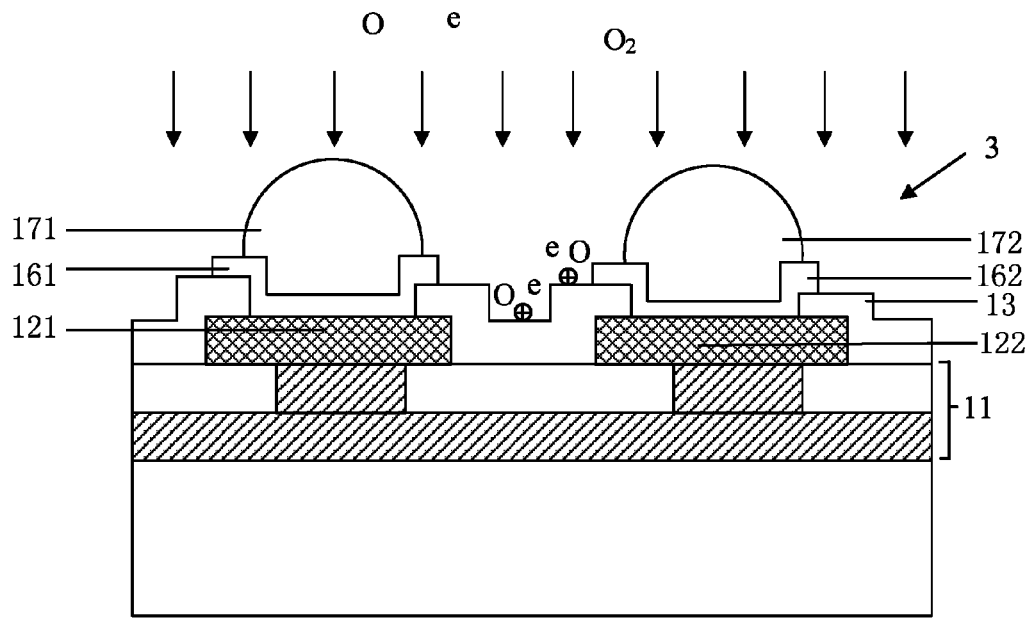
FIG. 3 illustrates another structure corresponding to certain stages of the exemplary treatment process of a chip packaging structure consistent with the disclosed embodiments.

FIG. 3 illustrates another structure corresponding to certain stages of the exemplary treatment process of a chip packaging structure illustrated in FIG. 4. At the beginning of the treatment process, a chip packaging structure is provided (S101).

As shown in FIG. 3, a chip packaging structure 3 having a first electrical connect structure 171 and a second electrical connect structure 172 is provided. In one embodiment, the first electrical connect structure 171 may be a first soldering ball 171; and the second electrical connect structure 172 may be a second soldering ball 172. In certain other embodiments, the number of the soldering balls may be more than two.

In one embodiment, the chip packaging structure 3 may be formed by forming certain structures on the chip packaging structure 1 illustrated in FIG. 1. Referring to FIG. 1 and FIG. 3, a first under-ball metal (UBM) layer 161 may be formed on the first soldering pad 121 and a portion of the insulation layer 13. Further, a second under ball metal (UBM) layer 162 may be formed on the second soldering pad 122 and a portion of the insulation layer 13. Further, after forming the first UBM layer 161 and the second UBM layer 162, a first soldering ball (bump) 171 may be formed on the first UBM layer 161; and a second soldering ball 172 may be formed on the second UBM layer 162.

The first soldering ball 171 may be electrically connected with the first solder pad 121 through the first UBM layer 161; and the second soldering ball 172 may be electrically connected with the second soldering pad 122 through the second UBM layer 162. The insulation layer 13 may electrically insulate the first soldering pad 121 and the second solder pad 122, the first UBM layer 161 and the second UBM layer 162; and the first soldering ball 171 and the second soldering ball 172.

The insulation layer 13 may be made of any appropriate material, such as silicon oxide, silicon nitride, or silicon oxynitride, etc. In one embodiment, the insulation layer 13 may be a passive layer to prevent moisture, or contaminations, etc. Thus, the insulation layer 13 may be made of silicon nitride.

In certain other embodiments, the metal of the soldering pads may have a relatively large stress. The stress may cause the dielectric layer of the metal interconnect structure 13 to crack. Thus, in order to avoid the crack, the insulation layer 13 may be made of polyimide.

The first UBM layer 161 and the second UBM layer 162 may be formed by any appropriate process. In one embodiment, the UBM layer 161 and the second UBM layer 162 may be formed by forming a metal layer (not labeled) on the first soldering pad 121, the second soldering pad 122 and the insulation layer 13. The metal layer may electrically connect with the first soldering pad 121 and the second soldering pad 122. After forming the metal layer, the metal layer may be patterned by any appropriate processes to form the first UBM layer 161 and the second UBM layer 162. In one embodiment, the metal layer may be patterned by a dry etching process.

The metal layer may be made of Ti or Cu, etc. During the dry etching process, the by-products may not be entirely removed. Thus, Ti cations or Cu cations may be deposited on the surface of the insulation layer 13. Further, the first soldering ball 171 and the second soldering ball 172 may be made of Cu, Sn, or Ag, etc. Thus, during the process for forming the first soldering ball 171 and the second soldering ball 172, Cu cations, Sn cations, or Ag cations may also be formed on the insulation layer 13. The metal cations deposited on the insulation layer 13 may cause a leakage issue between the first soldering ball 171 and the second soldering ball 172.

In certain other embodiments, the first soldering ball 171 and the second soldering ball 172 may be formed on the chip packaging structure 2 illustrated in FIG. 2. Correspondingly, the first UBM layer 161 may be formed on the first re-distribution layer 151; and the second UBM layer 162 may be formed on the second re-distribution layer 152. Then, the first soldering ball 171 may be formed on the first UBM layer 161; and the second soldering ball 172 may be formed on the second re-distribution layer 152. Such a chip packaging structure may increase the device density. Similarly, metal cations may be formed on the insulation layer 13 during the processes for forming the first UBM layer 161, the second UBM layer 162, the first soldering ball 171 and the second soldering ball 172. The metal cations may cause a leakage current issue between the first soldering ball 171 and the second soldering ball 172.

Returning to FIG. 4, after providing the chip packaging structure 1, a plasma gas may be selected for performing a plasma treatment process to remove the metal cations left on the insulation layer 13 (S102). The plasma gas may selected based on materials of the first UBM layer 161, the second UBM 162, the first soldering ball 171 and the second soldering ball 172 and a type of process forming the first UBM layer 161, the second UBM 162, the first soldering ball 171 and the second soldering ball 172. For example, if the first UBM layer 161, the second UBM 162, the first soldering ball 171 and the second soldering ball 172 are made of Cu, Sn, Ti or Ag, $O_2$ may be selected as the plasma gas. If the first UBM layer 161, the second UBM 162, the first soldering ball 171 and the second soldering ball 172 are made of Al, or Ti, $N_2$ may be selected as the plasma gas.

Further, after selecting the plasma gas, a plasma treatment process may be performed (103). The corresponding structure is referred to FIG. 2.

Referring to FIG. 3, a plasma treatment process is performed on the surface of the chip packaging structure 3 to remove the metal cations. Specifically, selected plasma, i.e., plasma using the selected plasma gas, may be used to bombard the first soldering ball 171, the second soldering ball 172, and the insulation layer 13.

In one embodiment, the plasma gas is $O_2$. Thus, the plasma may be referred as oxygen plasma. The $O_2$ pressure in the reaction chamber of the oxygen plasma treatment process may be in a range of approximately $1E10^{-9}$ Pa~$1E10^{-6}$ Pa. The voltage of the oxygen plasma may be in a range of approximately 900V~1100V. The frequency of the oxygen plasma may be in range of approximately 45 Hz~55 Hz.

During the oxygen plasma process, the $O_2$ may be ionized into O ions and electrons "e", etc. The O ions and the electrons "e" may react with metal cations. The following reactions may happen:

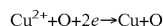

$Cu^{2+}+O+2e\rightarrow Cu+O$

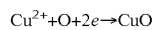

$Cu^{2+}+O+2e\rightarrow CuO$

The metal Cu and the CuO may be electrically neutral. Thus, the metal Cu and the CuO may not have an electrostatic attraction with the insulation layer 13; and the metal Cu and the CuO may be easy to be removed from the surface of the insulation layer 13. Further, the metal Cu and the CuO are not re-deposited on the insulation layer 13. Thus, it may only need to pump the reaction chamber to remove the Cu and the CuO.

In certain other embodiments, if the first soldering ball 171 and the second soldering ball 172 are made of Sn, or Ag, corresponding metal and metal oxide may be formed during the plasma treatment process; and may be removed by pumping the reaction chamber. Further, the Ti cations caused by the process for forming the first UBM layer 161 and the second UBM layer 162 may be also be removed by the oxygen plasma treatment process.

In one embodiment, the flow rate of $O_2$ may be in a range of approximately 5 sccm~25 sccm. Such a flow rate may aid the generated O ions and electrons to react with the metal cations to form the metal and/or the metal compounds.

The oxygen plasma treatment time may be in a range of approximately 100 s~150 s. In one embodiment, the treatment time is 120 s. Such a treatment time may not only ensure entirely neutralize the metal cations to form metal and/or metal compounds, but also avoid damage to the surface of insulation layer 13 during the process for bombarding first soldering ball 171, the second soldering ball 171, and the insulation layer 13.

In certain other embodiments, the gas of the plasma is $N_2$. Thus, the plasma may be referred as nitrogen plasma. The pressure of $N_2$ in the reaction chamber may be in a range of approximately $1E10^{-9}$ Pa~$1E10^{-6}$ Pa. The voltage of the nitrogen plasma may be in a range of approximately 900V~1100V. The frequency of the nitrogen plasma may be in a range of approximately 45 Hz~55 Hz. The power of the nitrogen plasma may be in a range of approximately 270 W~330 W.

In the nitrogen plasma treatment process, $N_2$ may be ionized into N ions and electrons "e", etc. The N ions and the electrons "e" may neutralize the Sn ions, Cu ions, Ti ions or Ag ions, etc., to form neutral metal or metal nitride, etc. The metal and the metal nitride may have no electrostatic attraction with the insulation layer 13; and it may be easy for the metal and the metal nitride to leave the surface of the insulation layer 13. Further, the metal and the metal nitride are not re-deposited on the surface of the insulation layer 13. Thus, it may only need to pump the reaction chamber to remove the metal and the metal nitride out the reaction chamber.

In one embodiment, the flow rate of $N_2$ may be in a range of approximately 5 sccm~25 sccm. Such a flow rate of $N_2$ may aid the N ions and the electrons generated by the nitrogen plasma process to react with the metal cations to form the metal and the metal nitride.

In one embodiment, the nitrogen plasma treatment time may be in a range of approximately 100 s~150 s. Such a treatment time may not only neutralize the metal cations to form the metal and/or the metal compounds; but also avoid damage to the surface of insulation layer 13 during the plasma treatment process.

Returning to FIG. 4, when the plasma treatment process is being performed, the reacted metal cations may be removed (104). The reacted metal cations are removed by pumping the reaction chamber After the plasma treatment process using one of $O_2$ and $N_2$, the metal cations may be removed. Thus, the leakage current issue between the first soldering ball 171 and the second soldering ball 172 may be overcome. Further, by using the oxygen plasma or the nitrogen plasma, the damage to the surface of the insulation layer 13 may be avoided. Therefore, the reliability of the chip packaging structure may be improved.

Returning FIG. 4, after the plasma treatment process, further processes may be performed, such as a wire bonding process, or a soldering process, etc. Then, molding compound may be applied on the chip packaging structure to sealing the devices, the wire, and soldering structures, etc.

Thus, a chip packaging structure may be formed by the above disclosed processes and methods; and the corresponding semiconductor structure is illustrated in FIG. 3. As shown in FIG. 3, the chip packaging structure may include a substrate (not labeled) and a metal interconnect structure 11 electrically connecting with devices in the substrate formed on the substrate. The chip packaging structure may also include a first soldering pad 121 and a second soldering pad 122 electrically connecting with the metal interconnect structure 11 formed on the first interconnect structure 11; and an insulation layer 13 electrically insulating the first soldering pad 121 and the second soldering pad 122 formed on the first metal interconnect structure 11. The insulation layer 13 is treated by oxygen plasma or nitrogen plasma to remove the metal cations on the surface. Further, the chip packaging structure may include a first UBM layer 161 formed on the first soldering pad 121, and a second UBM layer 162 formed on the second soldering pad 122. Further, the chip packaging structure may also include a first soldering ball 171 formed on the first UBM layer 161; and a second soldering ball 172 formed on the second UBM layer 162. The detailed structures and intermediate structures are described above with respect to the fabrication and treatment processes.

Therefore, according to the disclosed methods and structures, instead of using ordinary argon plasma, oxygen plasma or nitrogen plasma may be used to bombard the plurality of electrical connect structures and the insulation layer exposing the electrical connect structure. During the plasma treatment process, oxygen ions and electrons or nitrogen ions and electrons may neutralize and/or react with the metal cations deposited on the insulation layer during the packaging process. Thus, metal atoms and/or metal compounds may be formed. The metal atoms and the metal compounds may be electrically neutral. Thus, the metal atoms and/or the metal compounds may have no electrostatic attraction with the insulation layer; and it may be easy for the metal atoms and/or the metal compounds to leave the surface of the insulation layer. Further, it is not easy for the metal and/or the metal compounds to be re-deposited on the insulation layer. Thus, it may only need to pump the reaction chamber to remove the metal atoms and/or the metal compounds out the reaction chamber.

Further, the electrical connect structures may include any appropriate structures, such as soldering pads, re-distribution layers, under-ball metal layers, and soldering balls, etc. Metal ions may be formed on the insulation layer during the process for forming any of such structures. Thus, the plasma treatment process may be performed on one or more of such structures and the insulation layer to neutralize the metal cations to form metal atoms and/or metal compounds. After the plasma treatment process using the oxygen plasma or the nitrogen plasma, the metal cations formed on the insulation layers may be removed; and the surface of the insulation layer may not be damaged. Therefore, the leakage current issue between the electrical connect structures may be overcome; and the reliability of the chip packaging structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for treating a chip packaging structure, comprising:
    providing a chip packaging structure having at least a first electrical connect structure and a second electrical connect structure, and an insulation layer insulating the first electrical connect structure and the second electrical connect structure and also exposing portion or all of the first electrical connect structure and the second electrical connect structure;
    selecting a plasma gas based on materials of the first electrical connect structure and the second electrical connect structure and a type of process forming the first electrical connect structure and the second electrical connect structure, wherein metal cations are left on the insulation layer;
    performing a plasma treatment process using the selected plasma gas including at least one of oxygen and nitrogen on the first electrical connect structure, the second electrical connect structure and the insulation layer, to react with the metal cations left on the insulation layer to substantially convert the metal cations into electrically neutral materials without having an electrostatic attraction with the insulation layer; and
    removing the reacted metal cations from the insulation layer by pumping the reaction chamber.

2. The method according to claim 1, wherein:
    the first electrical connect structure is a first soldering pad; and
    the second electrical connect structure is a second soldering pad.

3. The method according to claim 1, wherein:
    the first electrical connect structure is a first re-distribution layer; and
    the second electrical connect structure is a second re-distribution layer.

4. The method according to claim 2, wherein:
    the first electrical connect structure includes a first soldering ball formed on the first soldering pad; and
    the second electrical connect structure includes a second soldering ball formed on the second soldering pad.

5. The method according to claim 3, wherein:
    the first electrical connect structure includes a first soldering ball formed on the first re-distribution layer; and
    the second electrical connect structure includes a second soldering ball formed on the second re-distribution layer.

6. The method according to claim 4, wherein:
    the first soldering ball and the second soldering ball are made of one of Cu, Sn and Ag; and
    the first soldering pad and the second soldering pad are made of one of Cu and Al.

7. The method according to claim 5, wherein:
    the first re-distribution layer and the second re-distribution layer are made of one of Cu and Al.

8. The method according to claim 4, wherein:
    a first under-ball metal layer is formed between the first soldering ball and the first soldering pad; and
    a second under-ball metal layer is formed between the second soldering ball and the second soldering pad.

9. The method according to claim 5, wherein:
    a first under-ball metal layer is formed between the first soldering ball and the first re-distributing layer; and a second under-ball metal layer is formed between the second soldering ball and the second re-distributing layer.

10. The method according to claim 6, wherein:
the first under-ball metal layer and the second under-ball metal layer are made of one of Ti and Cu.

11. The method according to claim 1, wherein:
the insulation layer is made of one of silicon oxide, silicon nitride and polyimide.

12. A method for treating a chip packaging structure, comprising:
providing a chip packaging structure having at least a first electrical connect structure and a second electrical connect structure, and an insulation layer insulating the first electrical connect structure and the second electrical connect structure and also exposing portion or all of the first electrical connect structure and the second electrical connect structure;
selecting a plasma gas based on materials of the first electrical connect structure and the second electrical connect structure and a type of process forming the first electrical connect structure and the second electrical connect structure, wherein metal cations are left on the insulation layer;
performing a plasma treatment process using the selected plasma gas including at least one of oxygen and nitrogen on the first electrical connect structure, the second electrical connect structure and the insulation layer, causing reaction of the metal cations to substantially convert the metal cations into electrically neutral materials; and
removing the reacted metal cations from the insulation layer, wherein:
a pressure of oxygen is in a range of approximately $1E10^{-9}$ Pa-1E10-6 Pa;
a flow rate of the oxygen is in a range of approximately 5 sccm-25 sccm;
a voltage of the plasma is in a range of approximately 900V-1100V;
a frequency of the plasma is in a range of approximately 45 Hz-55 Hz;
a power of the plasma is in a range of approximately 270 W-330 W; and
a plasma treatment time is in a range of approximately 100 s-150 s.

13. The method according to claim 12, wherein:
the first electrical connect structure is a first soldering pad; and
the second electrical connect structure is a second soldering pad.

14. The method according to claim 13, wherein:
the first electrical connect structure includes a first soldering ball formed on the first soldering pad; and
the second electrical connect structure includes a second soldering ball formed on the second soldering pad.

15. The method according to claim 14, wherein:
the first soldering ball and the second soldering ball are made of one of Cu, Sn and Ag; and
the first soldering pad and the second soldering pad are made of one of Cu and Al;

a first under-ball metal layer is formed between the first soldering ball and the first soldering pad; and
a second under-ball metal layer is formed between the second soldering ball and the second soldering pad.

16. A method for treating a chip packaging structure, comprising:
providing a chip packaging structure having at least a first electrical connect structure and a second electrical connect structure, and an insulation layer insulating the first electrical connect structure and the second electrical connect structure and also exposing portion or all of the first electrical connect structure and the second electrical connect structure;
selecting a plasma gas based on materials of the first electrical connect structure and the second electrical connect structure and a type of process forming the first electrical connect structure and the second electrical connect structure, wherein metal cations are left on the insulation layer;
performing a plasma treatment process using the selected plasma gas including at least one of oxygen and nitrogen on the first electrical connect structure, the second electrical connect structure and the insulation layer, causing reaction of the metal cations to substantially convert the metal cations into electrically neutral materials; and
removing the reacted metal cations from the insulation layer, wherein:
a pressure of nitrogen is in a range of approximately $1E10^{-9}$ Pa-$1E10^{-6}$ Pa;
a flow rate of nitrogen is in a range of approximately 5 sccm-25 sccm;
a voltage of the plasma is in a range of approximately 900V-1100V;
a frequency of the plasma is in a range of approximately 45 Hz-55 Hz;
a power of the plasma is in a range of approximately 270 W-330 W; and
a plasma treatment time is in a range of approximately 100 s-150 s.

17. The method according to claim 16, wherein:
the first electrical connect structure is a first re-distribution layer; and
the second electrical connect structure is a second re-distribution layer.

18. The method according to claim 17, wherein:
the first electrical connect structure includes a first soldering ball formed on the first re-distribution layer; and
the second electrical connect structure includes a second soldering ball formed on the second re-distribution layer.

19. The method according to claim 18, wherein:
the first re-distribution layer and the second re-distribution layer are made of one of Cu and Al.

20. The method according to claim 18, wherein:
a first under-ball metal layer is formed between the first soldering ball and the first re-distributing layer; and
a second under-ball metal layer is formed between the second soldering ball and the second re-distributing layer.

* * * * *